United States Patent [19]
Russell et al.

[11] Patent Number: 5,648,175
[45] Date of Patent: Jul. 15, 1997

[54] CHEMICAL VAPOR DEPOSITION REACTOR SYSTEM AND INTEGRATED CIRCUIT

[75] Inventors: Kathleen Russell, Santa Clara; Stuardo Robles, Sunnyvale; Bang C. Nguyen, Fremont; Visweswaren Sivaramakrishnan, Cupertino, all of Calif.

[73] Assignee: Applied Materials, Inc., Santa Clara, Calif.

[21] Appl. No.: 601,558

[22] Filed: Feb. 14, 1996

[51] Int. Cl.$^6$ .................... B32B 9/00; B05C 11/00
[52] U.S. Cl. .................... 428/472.3; 118/50; 118/697; 118/723 E; 118/723 VE; 118/725; 118/728; 427/97; 427/99; 427/294; 427/314; 427/570; 427/573; 427/578; 428/704
[58] Field of Search .................... 427/570, 573, 427/578, 294, 314; 118/697, 723 VE, 723 E, 725, 728, 50; 428/704, 472.3

[56] References Cited

U.S. PATENT DOCUMENTS

| | | | |
|---|---|---|---|
| 4,799,992 | 1/1989 | Rao et al. | 156/643 |
| 5,114,530 | 5/1992 | Rao et al. | 156/653 |
| 5,324,539 | 6/1994 | Maeda et al. | 427/255.3 |
| 5,401,305 | 3/1995 | Russo et al. | 106/287.1 |

OTHER PUBLICATIONS

Stephen M. Fisher et al., "Characterizing B–, P–, and Ge–Doped Silicon Oxide Films for Interlevel Dielectrics", *Solid State Technology*, (Sep. 1993), pp. 55–64.

*Primary Examiner*—Bernard Pianalto
*Attorney, Agent, or Firm*—Townsend and Townsend and Crew LLP

[57] ABSTRACT

A method of and apparatus for depositing a silicon oxide layer onto a wafer or substrate is provided. The present method includes introducing into a processing chamber a process gas including silicon, oxygen, boron, phosphorus and germanium to form a germanium doped BPSG oxide layer having a reflow temperature of less than 800° C. Preferred embodiments of the present method are performed in either a subatmospheric CVD or a plasma enhanced CVD processing apparatus.

19 Claims, 3 Drawing Sheets

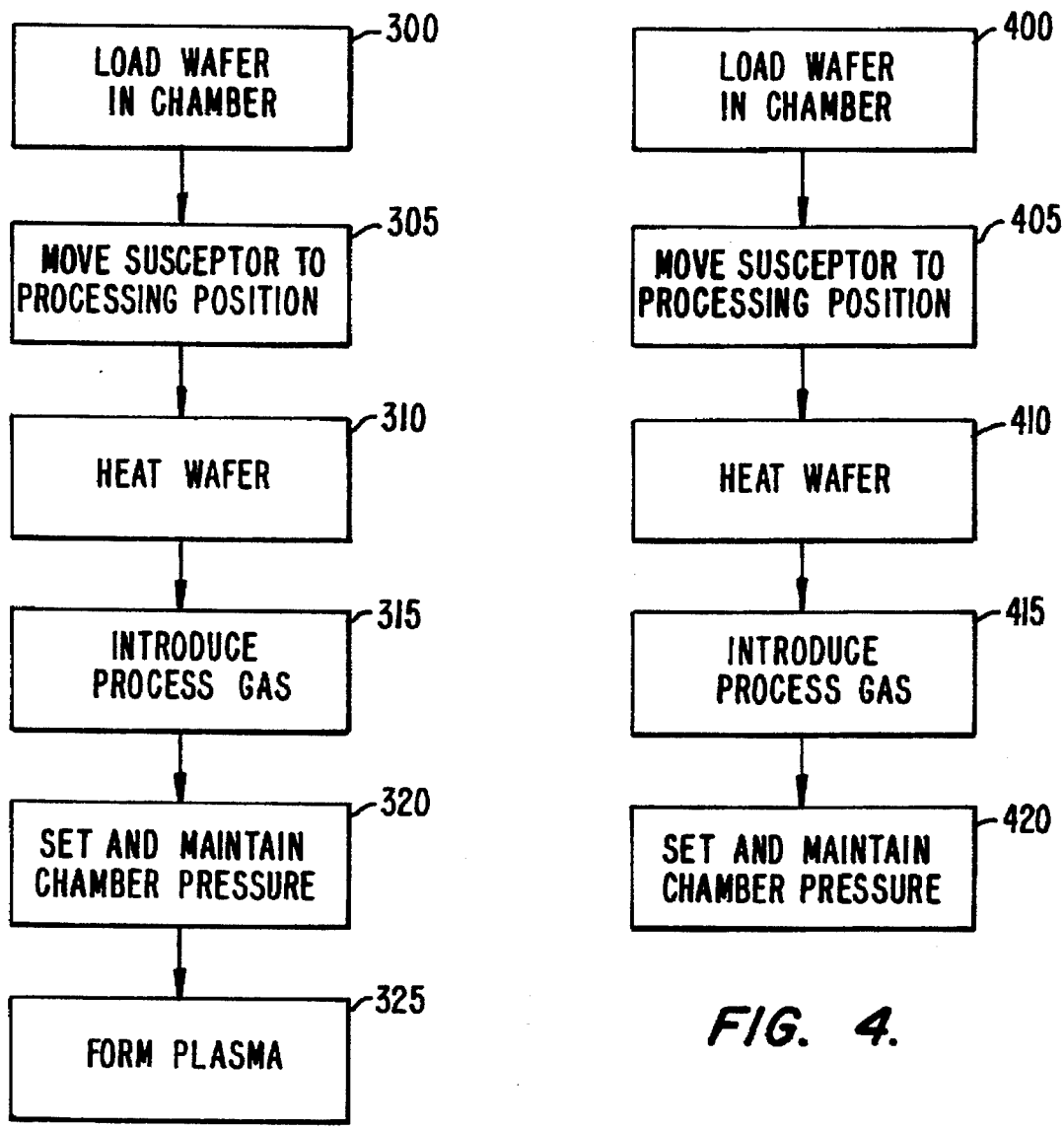

CHEMICAL VAPOR DEPOSITION REACTOR SYSTEM AND INTEGRATED CIRCUIT

BACKGROUND OF THE INVENTION

The present invention relates to the processing of semiconductor wafers. More particularly, the present invention relates to a germanium-doped boron phosphorus silicate glass layer formed over a semiconductor substrate and an improved method of forming the same. The present invention is particularly useful as a premetal dielectric layer but may also be applied to the formation of internal dielectric layers, passivation layers, and the like.

Silicon oxide is widely used as an insulating layer in the manufacture of semiconductor devices. A silicon oxide film can be deposited by thermal chemical vapor deposition (CVD) or plasma enhanced chemical vapor deposition (PECVD) processes from a reaction of silane ($SiH_4$), tetraethoxysilane ($Si(OC_2H_5)_4$), hereinafter referred to as "TEOS," or a similar silicon containing source with an oxygen containing source such as $O_2$, ozone ($O_3$), or the like.

One particular use for a silicon oxide film is as a separation layer between the polysilicon gate/interconnect layer and the first metal layer of MOS transistors. Such separation layers are referred to as premetal dielectric (PMD) layers because they are typically deposited before any of the metal layers in a multilevel metal structure. In addition to having a low dielectric constant, low stress and good adhesion properties, it is important for PMD layers to have good planarization characteristics.

When used as a PMD layer, the silicon oxide film is deposited over a lower level polysilicon gate/interconnect layer that usually contains raised or stepped surfaces. The initially deposited film generally conforms to the topography of the poly layer and is typically planarized or flattened before an overlying metal layer is deposited. A standard reflow process, in which the oxide film is heated to a temperature at which it flows, may be employed to planarize the film. Alternatively, a chemical mechanical polishing (CMP) or etching technique may be used.

Because of its low dielectric constant, low stress, good adhesion properties and relatively low reflow temperature, boron phosphorus silicate glass (BPSG) is one silicon oxide film that has found particular applicability in PMD layers. Standard BPSG films are formed by introducing a phosphorus containing source and a boron containing source into a processing chamber along with the silicon and oxygen containing sources normally required to form a silicon oxide layer. Examples of phosphorus containing sources include triethylphosphate (TEPO), triethylphosphite ($TEP_i$), trimethylphosphate (TMOP), trimethylphosphite ($TMP_i$), and similar compounds. Examples of boron containing sources include triethylborate (TEB), trimethylborate (TMB), and similar compounds.

Standard BPSG films have between a 3–5 weight percent (wt %) boron concentration and 3–6 wt % phosphorus concentration. At these concentration levels, the reflow temperature of known BPSG films is generally between about 800°–900° C.

Semiconductor integrated circuits currently being manufactured follow ultra high density (0.5 micron) design rules and circuits manufactured in the near future will follow even smaller design rules. At such small feature sizes, it becomes critical in some processes that reflow of PMD layers and other process steps be maintained at below 800° C. to maintain shallow junctions and prevent the degradation of self-aligned titanium silicide contact structures.

BPSG films can be produced to flow at below 800° C. by increasing the concentration level of boron to 5% or above. At such increased boron concentration levels, however, the stability of the BPSG layer is adversely affected. Of course methods other than reflow, such as chemical mechanical polishing or etching, can also be used to planarize PMD oxide layers as appropriate.

From the above it can be seen that there is a need for a dielectric layer and method of forming such a layer, that has a low dielectric constant, high stability, low stress, good adhesion, and other characteristics sufficient for use as a PMD layer, that can be reflowed at a temperature of 800° C. or below.

Thermal processes have been proposed in which germanium is added to a BPSG layer to lower the layer's reflow temperature. Such processes include low pressure chemical vapor deposition (LPCVD) and atmospheric chemical vapor deposition (APCVD) methods. In both processes, the use of $TEP_i$ as the phosphorus source results in the formation of unstable $P_2O_3$ bonds in the silicon oxide film thereby producing a film of relatively low stability. A further problem with both these proposed processes is that deposition rate of Ge-BPSG films deposited using either processes (APCVD and LPCVD) is relatively low thus adversely effecting wafer throughput.

SUMMARY OF THE INVENTION

The present invention solves the above problems of the prior art by providing a dielectric layer that has a low dielectric constant, high stability, low stress, good step coverage and good adhesion properties. The layer can be deposited at between at least 4000–5000 Å/minute and can be reflowed at a temperature of between about at least 700–800° C. The present invention also provides a method and apparatus for forming such a dielectric layer.

In one embodiment of the present invention, a method of depositing an insulating layer is disclosed. The method includes the steps of introducing germanium along with boron, phosphorus, oxygen and silicon in a processing chamber and setting the pressure within the chamber to between about 100–600 torr to form a germanium-doped boron phosphorus silicate glass (Ge-BPSG) layer. Germanium may be introduced from a source such as tetramethoxygermane (TMOG), tetraethoxy germanium (TEOG) or a similar source.

In another embodiment of the method according to the present invention, a germanium source, such as TMOG, is added to a process gas including boron, phosphorus, silicon and oxygen that is then introduced into a processing chamber. A plasma is formed from the process gas to deposit a germanium-doped BPSG layer over a substrate disposed in the chamber.

An apparatus according to one embodiment of the present invention introduces a process gas including germanium, boron, phosphorus, oxygen and silicon through a gas distribution manifold into a vacuum chamber in which a wafer being processed is situated. A processor, running a computer program stored in a connected memory, controls a heater and vacuum system to set and maintain the temperature and pressure in the chamber for the deposition process. The processor also controls a source distribution system to set the rate and ratio at which source gases and liquids are mixed to form the process gas and the rate at which the process gas is introduced into the vacuum chamber.

An apparatus according to another embodiment of the present invention introduces a process gas including germanium, boron, phosphorus, oxygen and silicon through a gas distribution manifold into a vacuum chamber in which a wafer being processed is situated. A power supply provides a voltage at a selected frequency to form a plasma from the gases and deposit a germanium-doped BPSG layer on the wafer. A heater and vacuum system are employed to set and maintain the temperature and pressure in the chamber for the deposition process, and a source distribution system is used to set the rate and ratio at which source gases and liquids are introduced to form the process gas. The power supply, heater, vacuum system and source distribution system are all controlled by a processor running a computer program stored in a connected memory.

These and other embodiments of the present invention along with many of its advantages and features are described in more detail in conjunction with the text below and attached figures.

BRIEF DESCRIPTION OF THE DRAWINGS

FIG. 1 is a vertical, cross-sectional view of a simplified, parallel plate chemical vapor deposition reactor in which the present invention can be carried out in;

FIG. 3 is a flowchart illustrating steps undertaken in formation of a germanium-doped BPSG layer according to one embodiment of the method of the present invention.

FIG. 4 is a flowchart illustrating steps undertaken in formation of a germanium-doped BPSG layer according to another embodiment of the method of the present invention.

DETAILED DESCRIPTION OF THE PREFERRED EMBODIMENTS

I. Exemplary CVD Reactor System

Figure 1:
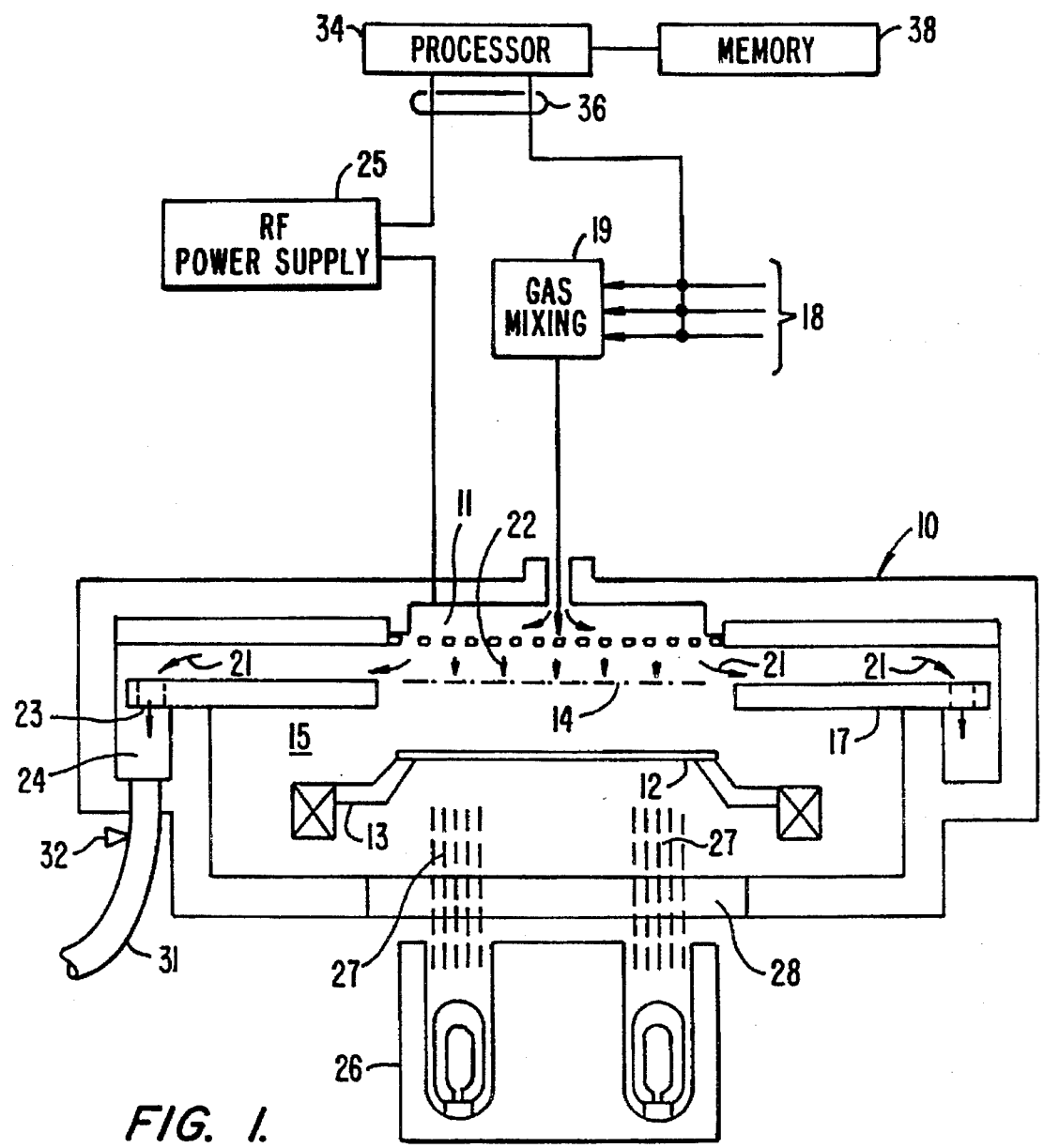

The germanium-doped BPSG layer according to the present invention can be formed in a variety of different chemical vapor deposition (CVD) processing machines. One suitable CVD machine in which the method of the present invention can be carried out in is shown in FIG. 1 which is a vertical, cross-sectional view of a simplified, parallel plate chemical vapor deposition system 10 having a vacuum chamber 15. CVD system 10 contains a gas inlet manifold 11 for dispersing deposition gases to a wafer, not shown, that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate 17 having a plurality of spaced holes 23 which exhaust into an annular vacuum manifold 24. Deposition and carrier gases are supplied through gas lines 18 into a mixing chamber 19 where they are combined and then sent to manifold 11. During processing, gas supplied to manifold 11 is uniformly distributed radially across the surface of the wafer as indicated by arrows 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 can be either a thermal process or a plasma enhanced process. In a plasma process, a controlled plasma is formed adjacent to the wafer by RF energy applied to inlet manifold 11 from RF power supply 25. Inlet manifold 11 is also an RF electrode, while susceptor 12 is grounded. RF power supply 25 can supply either single or mixed frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

A motor, not shown, raises and lowers susceptor 12 between processing position 14 and a lower, wafer-loading position. The motor, gas supply valves connected to gas lines 18, throttle valve and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., the assignee of the present invention, which is incorporated herein by reference for all purposes.

The above CVD system description is mainly for illustrative purposes and should not be considered as limiting the scope of the present invention. Variations of the above described system such as variations platen or susceptor design, heater design, location of RF power connections and others are possible. Additionally, other CVD equipment such as inductively coupled plasma CVD devices, electron cyclotron resonance (ECR) plasma CVD devices or the like may be employed. The dielectric layer and method for forming such a layer of the present invention is not limited to any specific apparatus or to any specific plasma excitation method.

II. Formation of a Germanium-Doped BPSG Layer

A. Plasma Enhanced Chemical Vapor Deposition

In one embodiment of the process of the present invention, deposition of the Ge-doped BPSG layer is performed in a PECVD processing apparatus as described above outfitted for 200 mm wafers. Formation of the Ge-BPSG layer according to this embodiment allows for increased deposition rate and lower deposition temperature than does formation of the layer in either low pressure CVD (LPCVD) or atmospheric pressure CVD (APCVD) processes.

To form the Ge-BPSG film of this embodiment, the wafer being processed is loaded on susceptor 12 in vacuum chamber 15 through a vacuum-lock door and moved into processing position 14 (FIG. 3, steps 300 and 305). In processing position 14, the wafer is generally less than one centimeter from gas distribution manifold 11. Preferably, the wafer is positioned between about 220–275 mils from the gas distribution manifold. Such spacing confines the reactant gases between the wafer and manifold, increasing reaction efficiency and deposition rate, and helping confine the deposition of material to the surface of the wafer. Prior to steps 300 and 305, the wafer has typically been subjected to multiple processing steps to form active devices on the substrate surface.

Once the wafer is properly positioned, the wafer and susceptor are heated to a temperature of between 400° and 500° C. (step 310) and a process gas is introduced into the chamber from manifold 11 (step 315). Preferably, the wafer and susceptor are heated to a temperature of between 430° and 480° C.

The process gas includes sources of phosphorus, boron, silicon, oxygen and germanium which are introduced through a source distribution system and mixed together in gas mixing system 19. The rate at which the individual sources which form the process gas are introduced into gas mixing system 19 is controlled by processor 34 through appropriate gas supply lines and valves of the source distribution system. In a preferred version of this embodiment, TEPO, TEB, TEOS and TMOG (Ge(OCH$_3$)$_4$) are used as the phosphorus, boron, silicon, and germanium sources, respectively. In other embodiments, TEOG (Ge(OC$_2$H$_5$)$_4$) may be used as the germanium source, TMP$_i$ may be employed as the phosphorus containing source and TMB may be used as the boron containing source. It is believed that the use of either TEPO or TMP$_i$ is preferable to the use of TEP$_i$ for the phosphorus source because the use of TEP$_i$ results in a doped silicon lattice structure having a greater percentage of unstable P$_2$O$_3$ molecules than does the use of TEPO or TMP$_1$. A person of ordinary skill in the art will recognize that other silicon, boron and germanium sources may also be used.

TEOS, TEB, TEPO and TMOG are all liquid sources which are vaporized by conventional boiler-type or bubbler-type hot boxes or preferably by a liquid injection system. A liquid injection system provides greater control of the volume of reactant gases introduced into the gas mixing system. The vaporized gases are then mixed in the gas mixing system with a helium carrier gas before being delivered to the gas distribution manifold. An oxygen mixture such as O$_2$, N$_2$O or the like is used as the oxygen containing source.

In this preferred version where the chamber is designed for 200 mm substrates, TEPO is introduced at a rate of between about 10–100 mgm, and preferably is introduced at a rate of between about 15–40 mgm. TEB is introduced at a rate of between about 10–500 mgm and preferably is introduced at a rate of between 50–100 mgm. TEOS is introduced at a rate of between about 500–1200 mgm and preferably is introduced at a rate of between about 600–800 mgm, and TMOG is introduced at a rate of between about 10–100 mgm and preferably is introduced at a rate of between about 15–40 mgm.

The helium carrier gas is introduced into the gas mixing system at a selected flow rate of between about 700–1000 sccm and preferably at a selected flow rate of between about 800–1000 sccm. The flow rate of the oxygen gas is between about 500–1500 sccm and preferably between about 700–1000 sccm. The ratio of TMOG:TEOS is between about 0.0125–0.25:1. The total rate of flow of gases into the processing chamber is between about 1200–2500 sccm.

A selected pressure of between about 1–20 torr in the reaction chamber is set and maintained throughout deposition by throttle valve 32 in conjunction with the vacuum pump system and the introduction of the process gas (step 320). Preferably, pressure in the chamber is set and maintained at a selected pressure of between about 5–16 torr. After processing conditions are set, a plasma is formed (step 325) using a single or mixed frequency RF power supply to deposit the Ge-BPSG thin film layer. The power supply is driven at a high frequency of 13.56 MHz at between 0–1200 Watts and at a low frequency of about 350 KHz at between about 0–500 Watts. The actual power used should be selected to achieve a desired plasma density and should be scaled according to chamber size if other chambers are employed.

After deposition of the Ge-BPSG film, the wafer may be transferred to a furnace where the film is reflowed at a temperature of about 800° C. for between 30–40 minutes in nitrogen or a similar inert atmosphere.

The above described gas flow, chamber pressure and temperature ranges provide for a Ge-BPSG film that is deposited at a rate of between about 4000–5000 Å/minute. The film has a boron concentration level of between 3–5 wt %, a phosphorus concentration level of between 3–6 wt % and a germanium concentration level of between 3–6 wt %. The refractive index of the film is about 1.45 and it is has about a 1 percent film thickness uniformity.

The deposited film is a highly conformal silicon dioxide coating that fills in topographical irregularities while providing a substantial planar surface. The film has a stress level of between about $-1.0*10^{-8}$ to $1.0*10^{-8}$ dynes/cm$^2$, a dielectric constant of approximately 4.0, and good adhesion properties.

B. Subatmospheric Chemical Vapor Deposition

In another embodiment of the present invention, deposition of a Ge-doped BPSG layer is performed in an SACVD processing apparatus as described above outfitted for 200 mm wafers.

To form the Ge-BPSG layer of this embodiment, the wafer is loaded in vacuum chamber 15 onto susceptor 12 through a vacuum-lock door (step 400). Susceptor 12 is then moved to processing position 14 (step 405) and the wafer is subject to reactant gases exhausted from the gas distribution manifold.

The wafer is generally positioned less than one centimeter from gas distribution manifold 11 in processing position 14, and preferably, the wafer is between about 230–275 mils from the gas distribution manifold. Such spacing confines the reactant gases between the wafer and manifold increasing reaction efficiency and deposition rate and helps confine the deposition of material to the surface of the wafer. Prior to steps 400 and 405, the wafer has typically been subjected to multiple processing steps as discussed above.

Once the wafer is properly positioned, the wafer and susceptor are heated to a temperature of between 400° and 500° C. (step 410) and a process gas is introduced from the manifold (step 415). Preferably, the wafer and susceptor are heated to a temperature of between 450° and 480° C.

The process gas includes a phosphorus containing source, a boron containing source, a silicon containing source, an oxygen containing source and a germanium containing source which are introduced from a source distribution system and mixed together in gas mixing system 19.

The rate at which the individual sources are introduced into gas mixing system 19 is controlled by processor 34 through appropriate gas supply lines and valves of the source distribution system. In a preferred version of this embodiment, TEPO, TEB, TEOS, ozone and TMOG are used as the phosphorus, boron, silicon, oxygen and germanium sources, respectively. TEPO is preferable to TMP$_i$ as a phosphorus source because TMP$_i$ reacts to readily with ozone preventing proper process control of TMP$_i$ flow rates. TEPO is also preferable to TEP$_i$ because the reaction of TEP$_i$ and ozone forms a doped silicon lattice structure in which approximately 0.5 wt % of the phosphorus containing molecules are highly unstable $P_2O_3$ molecules. In other embodiments, TMB or similar sources may be used as the boron containing source and other silicon, oxygen or germanium sources may be employed.

TEOS, TEB, TEPO and TMOG are all liquid sources which are vaporized by convention boiler-type or bubbler-type hot boxes or preferably by a liquid injection system. A liquid injection system provides greater control of the volume of reactant gases introduced into the gas mixing system. The vaporized gases are then mixed in the gas mixing system with a helium carrier gas before being delivered to the gas distribution manifold. An oxygen/ozone mixture is used as the oxygen containing source.

In this embodiment, the vaporized TEOS, TEB, TEPO and TMOG sources are introduced into the gas mixing system at selected rates of flow. TEOS is introduced at a rate of between about 200–600 mgm and preferably is introduced at a rate of between about 400–500 mgm. TEB is introduced at a rate of between about 50–300 gm and preferably is introduced at a rate of between 200–280 mgm. TEPO is introduced at a rate of between about 40–90 mgm and preferably is introduced at a rate of between about 50–75 mgm, and TMOG is introduced at a rate of between about 30–90 mgm and preferably is introduced at a rate of between about 50–75 mgm.

The helium carrier gas is introduced into the gas mixing system at a selected flow rate of between about 2000–8000 sccm and preferably at a flow rate of between about 4000–6000 sccm. The flow rate of the ozone gas is between about 2000–6000 sccm and preferably between about 3000–5000 sccm. The ozone/oxygen mixture contains between 2–14% weight ozone and preferably contains between 8–12% weight ozone. The ratio of TMOG:TEOS is between about 0.05–0.45:1. The total rate of flow of gases into the processing chamber is between about 7.5–11.5 slm.

A selected pressure of between about 100–600 torr in the reaction chamber is set and maintained throughout deposition by throttle valve 32 in conjunction with the vacuum pump system and introduction of the process gas (step 420). Preferably, pressure within the chamber is set and maintained at between about 200–250 torr.

After deposition of the BPSG film, the wafer may be transferred to a furnace where the film is reflowed at a temperature of about 700°–800° C. for between 30–40 minutes in a nitrogen or similar inert gas atmosphere.

The above described gas flow, chamber pressure and temperature ranges provide for a Ge-BPSG film that is deposited at a rate of between about 4000–5000 Å/minute. The film has a boron concentration level of between 3–5 wt %, a phosphorus concentration level of between 3–6 wt % and a germanium concentration level of between 3 and 6 wt %. The refractive index of the film is about 1.45 and it is has about a 1% film thickness uniformity.

The deposited film is a highly conformal silicon dioxide coating that fills in topographical irregularities while providing a substantial planar surface. The film has a stress level of between about $-1.0*10^{-8}$ to $1.0*10^{-8}$ dynes/cm$^2$, a dielectric constant of approximately 4.0, excellent gas fill properties and good adhesion properties.

III. Exemplary Structure

Figure 2:
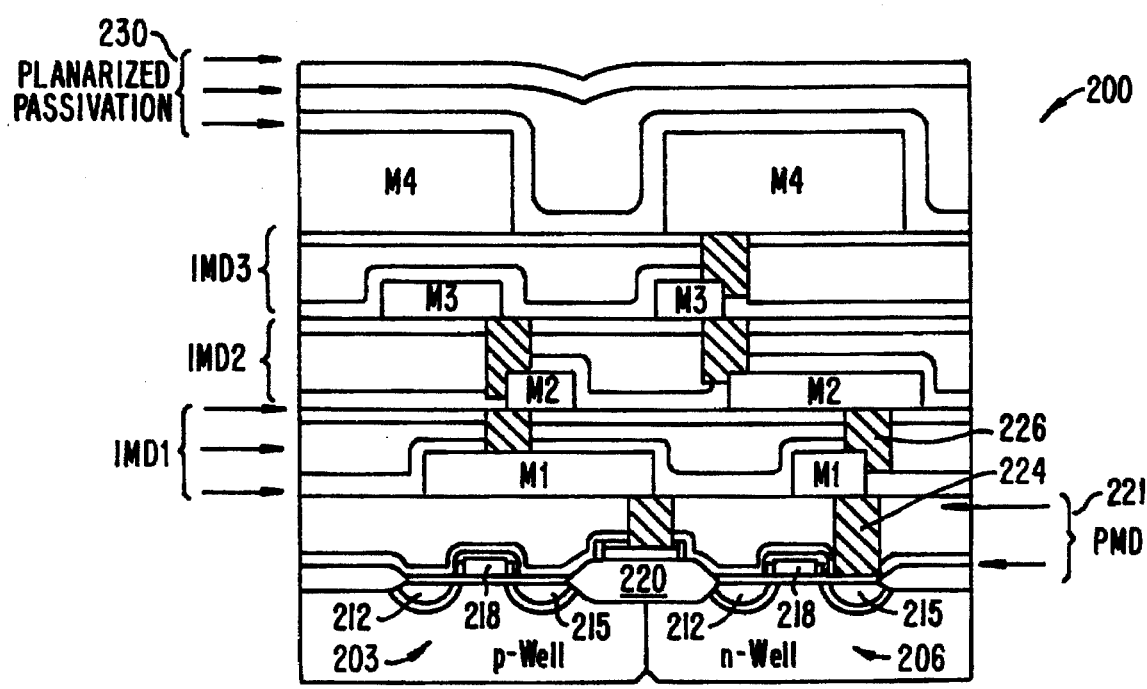
FIG. 2 is a simplified cross-sectional view of a semiconductor device manufactured according to the method of the present invention.

FIG. 2 illustrates a simplified cross-sectional view of an integrated circuit 200 according to the present invention. As shown, integrated circuit 200 includes NMOS and PMOS transistors 203 and 206, which are separated by a field oxide region 209. Each transistor 203 and 206 comprises a source region 212, a drain region 215 and a gate region 218. The transistors are electrically isolated from each other by field oxide region 220.

A premetal dielectric layer 221 separates transistors 203 and 206 from metal layer M1 with connections between metal layer M1 and the transistors made by contacts 224. Metal layer M1 is one of four metal layers, M1–M4, included in integrated circuit 200. Each metal layer M1–M4 is separated from each other by respective inter-metal dielectric layers IMD1, IMD2 or IMD3. Adjacent metal layers are connected at selected openings by vias 226. Deposited over metal layer M4 are planarized passivation layers 230.

While the dielectric layer of the present invention may find uses in each of the dielectric layers shown in integrated circuit 200, physical properties of the film as its low reflow temperature, low stress, good adhesion characteristics, low dielectric constant, and high deposition rate along with the relatively low deposition temperatures allowed by either the SACVD or PECVD processes of preferred embodiments make it is most useful as an insulation layer between the substrate and metal layer M1 as shown by PMD layer 221.

It should be understood that simplified integrated circuit 200 is for illustrative purposes only. One of ordinary skill in the art would be able to implement the present method for fabrication of other integrated circuits such as microprocessors, application specific integrated circuits (ASICS), memory devices, and the like.

Having fully described several embodiments of the present invention, many other equivalent or alternative methods of depositing the low dielectric constant oxide layer according to the present invention will be apparent to those skilled in the art. These equivalents and alternatives are intended to be included within the scope of the present invention.

What is claimed is:

1. A chemical vapor deposition reactor system comprising:

a housing for forming a vacuum chamber;

a substrate holder, located within said housing, for holding a substrate;

a gas distributor for introducing a process gas into said vacuum chamber to deposit a layer over said substrate;

a gas mixing area, coupled to said gas distributor, in which a plurality of gases intermingle to form said process gas;

a gas distribution system, coupled to said gas mixing area, for introducing said plurality of gases into said gas mixing area;

a heater for heating said substrate;

a vacuum system for pressurizing said vacuum chamber;

an RF power supply to form a plasma from said process gas;

a controller for controlling said gas distribution system, said heater, said RF power supply and said vacuum system; and a memory, coupled to said controller, comprising a computer-readable medium having a computer-readable program embodied therein for directing operation of said chemical vapor deposition reactor system, said computer-readable program including:

a first set of computer instructions for controlling said heater to heat said substrate to a temperature of between about 400°–500° C.;

a second set of computer instructions for controlling said vacuum system to set and maintain said vacuum chamber at a pressure of between about 1–20 torr;

a third set of computer instructions for controlling said gas distribution system to introduce gases comprising silicon, oxygen, boron, phosphorus and germanium into said gas mixing area; and a fourth set of computer instructions for controlling said RF power supply to form said plasma.

2. The chemical vapor deposition reactor system of claim 1 wherein said RF power supply is a mixed frequency power supply having high frequency and low frequency components and wherein said fourth set of instructions operates said high frequency component of said RF power supply at between about 100–1000 Watts and operates said low frequency component of said RF power supply at between about 20–450 Watts.

3. The chemical vapor deposition reactor system of claim 2 wherein said fourth set of instructions drives said high frequency component of said RF power supply at a frequency of about 13.56 MHz and said low frequency component of said RF power supply at a frequency of about 350 KHz.

4. The chemical vapor deposition reactor system of claim 1 wherein said phosphorus is introduced into said gas mixing chamber from said source distribution system in the form of either triethylphosphate (TEPO) or trimethylphosphite ($TMP_i$).

5. The chemical vapor deposition reactor system of claim 4 wherein said layer is deposited over said substrate at a rate of at least about 4000 Angstroms per minute.

6. A chemical vapor deposition reactor system comprising:

a housing for forming a vacuum chamber;

a substrate holder, located within said housing, for holding a substrate;

a gas distributor for introducing a process gas into said vacuum chamber to deposit a layer over said substrate;

a gas mixing area, coupled to said gas distributor, in which a plurality of gases intermingle to form said process gas;

a gas distribution system, coupled to said gas mixing area, for introducing said plurality of gases into said gas mixing area;

a heater for heating said substrate;

a vacuum system for pressurizing said vacuum chamber;

a controller for controlling said gas distribution system, said heater and said vacuum system; and a memory, coupled to said controller, comprising a computer-readable medium having a computer-readable program embodied therein for directing operation of said chemical vapor deposition reactor system, said computer-readable program including:

a first set of computer instructions for controlling said heater to heat said substrate to a temperature of between about 400°–500° C.;

a second set of computer instructions for controlling said vacuum system to set and maintain said vacuum chamber at a pressure of between about 100–600 torr; and a third set of computer instructions for controlling said gas distribution system to introduce said gases comprising silicon, oxygen, boron, phosphorus and germanium into said gas mixing chamber.

7. The chemical vapor deposition reactor system of claim 6 wherein said phosphorus is introduced into said gas mixing chamber from said source distribution system in the form of either triethylphosphate (TEPO) or trimethylphosphite ($TMP_i$).

8. The chemical vapor deposition reactor system of claim 7 wherein said layer is deposited over said substrate at a rate of at least about 4000 Angstroms per minute.

9. An integrated circuit formed on a semiconductor substrate, said integrated circuit comprising:

(a) a plurality of active devices formed in said substrate;

(b) a metal layer formed over said substrate;

(c) an insulating layer comprising a germanium-doped boron phosphorus silicate glass film comprising between 3.0–5.0 weight percent boron, 3.0–6.0 weight percent phosphorus and 3.0–6.0 weight percent germanium formed between said substrate and said metal layer, said insulating layer having a plurality of patterned holes filled with electrically conductive material to electrically couple selected portions of said metal layer to selected areas of said plurality of active devices, said insulating layer being deposited at a rate of at least 4000 Angstroms per minute.

10. The integrated circuit of claim 9 wherein said insulating layer is deposited by a plasma reaction of a process gas comprising silicon, boron, phosphorus, oxygen and germanium in a processing chamber maintained at a pressure of between 5–16 torr and heated to a temperature of between 400°–500° C.

11. The integrated circuit of claim 9 wherein said insulating layer is deposited by a thermal reaction of a process gas comprising silicon, boron, phosphorus, oxygen and germanium in a processing chamber maintained at a pressure of between 100–600 torr and heated to a temperature of between 400°–500° C.

12. A substrate processing apparatus comprising:

(a) a processing chamber;

(b) a gas delivery system configured to deliver a process gas to said processing chamber;

(c) a plasma generation system configured to form a plasma from said process gas;

(d) a controller configured to control said gas delivery system and said plasma generation system; and (e) a memory, coupled to said controller, comprising a computer-readable medium having a computer-readable program embodied therein for directing operation of said substrate processing apparatus, said computer-readable program including:

(i) a first set of computer instructions for controlling said gas delivery system to introduce a process gas comprising boron, phosphorus, silicon, oxygen and germanium into said substrate processing chamber; and (ii) a second set of computer instructions for controlling said plasma generation system to form a plasma from said process gas to deposit a germanium-doped boron phosphorus silicate (BPSG) glass layer on a substrate in said chamber.

13. The apparatus of claim 12 further comprising a vacuum system configured to set and maintain a selected pressure within said chamber and wherein said controller is configured to control the operation of said vacuum system and said computer-readable program further comprises a third set of computer instructions for controlling said vacuum system to maintain pressure within said chamber at between about 1–20 torr.

14. The apparatus of claim 13 further comprising a heating system configured to heat said chamber to a selected temperature and wherein said controller is configured to control the operation of said heating system and said computer-readable program further comprises a fourth set of computer instructions for controlling said heater system to heat an upper surface of the substrate to a temperature of between about 400°–500° C.

15. The apparatus of claim 14 wherein said computer-readable instructions control said gas distribution system, said heating system and said vacuum system such that said germanium-doped BPSG layer is deposited at a rate greater than about 4000 Angstroms per minute.

16. A substrate processing apparatus comprising:
   (a) a processing chamber;
   (b) a gas delivery system configured to deliver a process gas to said processing chamber;
   (c) a heating system configured to heat said chamber to a selected temperature;
   (d) a vacuum system configured to set and maintain a selected pressure within said chamber;
   (e) a controller configured to control said gas delivery system, said vacuum system and said heating system; and
   (f) a memory, coupled to said controller, comprising a computer-readable medium having a computer-readable program embodied therein for directing operation of said substrate processing apparatus, said computer-readable program including:
      (i) a first set of computer instructions for controlling said gas delivery system to introduce a process gas comprising boron, phosphorus, germanium, tetraethyloxysilane (TEOS) and ozone into said chamber;
      (ii) a second set of computer instructions for controlling said vacuum system to set and maintain a pressure of between about 100–600 torr in said chamber; and
      (iii) a third set of computer instructions for controlling said heating system to heat an upper surface of a substrate in said chamber to a temperature of between about 400°–500° C. to deposit a germanium-doped boron phosphorus silicate glass layer on said substrate.

17. The apparatus of claim 16 wherein said computer-readable instructions control said gas distribution system, said heating system and said vacuum system such that said germanium-doped BPSG layer is deposited at a rate greater than about 4000 Angstroms per minute.

18. The apparatus of claim 16 wherein said gas delivery system introduces triethylphosphate (TEPO) into said chamber.

19. The apparatus of claim 16 wherein said second set of computer instructions controls said vacuum system to set and maintain pressure within the processing chamber at between about 200–250 torr and wherein said third set of computer instructions controls said heater to heat an upper surface of the substrate to a temperature of between about 450°–480° C.

* * * * *